(12) United States Patent
Bhardwaj et al.

(10) Patent No.: US 10,491,234 B1
(45) Date of Patent: Nov. 26, 2019

(54) CONFIGURABLE OVERSAMPLING FOR AN ANALOG-TO-DIGITAL CONVERTER

(71) Applicant: TEXAS INSTRUMENTS INCORPORATED, Dallas, TX (US)

(72) Inventors: Manish Bhardwaj, Sugar Land, TX (US); Devin Allen Cottier, Houston, TX (US); David Peter Foley, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/200,236

(22) Filed: Nov. 26, 2018

Related U.S. Application Data

(60) Provisional application No. 62/688,821, filed on Jun. 22, 2018.

(51) Int. Cl.
| | | |
|---|---|---|
| *H03M 1/50* | (2006.01) | |
| *H03M 3/00* | (2006.01) | |
| *H03M 1/36* | (2006.01) | |

(52) U.S. Cl.
CPC ............ *H03M 3/34* (2013.01); *H03M 1/361* (2013.01); *H03M 1/504* (2013.01)

(58) Field of Classification Search
CPC ......... H03M 3/34; H03M 1/504; H03M 1/361
USPC ........................................................ 341/166
See application file for complete search history.

(56) References Cited

U.S. PATENT DOCUMENTS

| | | | | |
|---|---|---|---|---|
| 6,208,279 B1* | 3/2001 | Oprescu | ............... | H03M 3/374 341/143 |
| 6,367,003 B1* | 4/2002 | Davis | .................... | G06F 9/3001 712/208 |
| 6,979,987 B2* | 12/2005 | Kernahan | ............. | H02M 3/157 323/283 |
| 8,560,592 B2* | 10/2013 | Rubio | ................... | G06F 7/5443 708/620 |
| 2004/0095119 A1* | 5/2004 | Kernahan | ............. | H02M 3/157 323/282 |
| 2013/0024673 A1* | 1/2013 | Yamazaki | ........... | G06F 9/30079 712/225 |

* cited by examiner

*Primary Examiner* — Jean B Jeanglaude
(74) *Attorney, Agent, or Firm* — Ebby Abraham; Charles A. Brill; Frank D. Cimino

(57) ABSTRACT

A system includes a central processing unit (CPU) core, and a pulse width modulator (PWM) controller configured to generate a PWM control signal having a PWM cycle. The system also includes an analog-to-digital converter (ADC), an accumulator, a sum register, and an oversampling register set. The oversampling register set is configurable by the CPU core to specify time points during each PWM cycle when the ADC is to convert an analog signal to a digital sample to produce a plurality of digital samples. The time spacing between consecutive digital samples varies among the specified time points. The accumulator accumulates digital samples from the ADC and stores an accumulated sum in the sum register. The CPU core reads the accumulated sum from the sum register, and can use the accumulated sum to calculate a metric (e.g., an average) of the digital samples.

20 Claims, 4 Drawing Sheets

CONFIGURABLE OVERSAMPLING FOR AN ANALOG-TO-DIGITAL CONVERTER

RELATED APPLICATIONS

This application claims priority to U.S. Provisional Application No. 62/688,821, filed Jun. 22, 2018, which is hereby incorporated by reference.

BACKGROUND

An analog-to-digital converter (ADC) converts an analog signal into a digital value. ADCs are used in a wide variety of applications. In some implementations, the ADC is used to "oversample" the analog signal. Oversampling an analog signal comprises performing multiple conversions of the analog signal and then averaging the resulting digital values together, Oversampling is useful to filter out various sources of noise such as noise that may be present on the analog signal from a sensor, noise inherent in the analog-to-digital conversion process, etc.

SUMMARY

In one example, a system includes a central processing unit (CPU) core, and a pulse width modulator (PWM) controller configured to generate a PWM control signal having a PWM cycle. The system also includes an analog-to-digital converter (ADC), an accumulator, a sum register, and an oversampling register set. The oversampling register set is configurable by the CPU core to specify time points during each PWM cycle when the ADC is to convert an analog signal to a digital sample to produce a plurality of digital samples. The time spacing between consecutive digital samples varies among the specified time points. The accumulator accumulates digital samples from the ADC and stores an accumulated sum in the sum register. In some examples, the CPU core reads the accumulated sum from the sum register and the number of samples converted, and can use the accumulated sum and the number of samples converted to calculate a metric (e.g., an average) of the digital samples.

BRIEF DESCRIPTION OF THE DRAWINGS

For a detailed description of various examples, reference will now be made to the accompanying drawings in which.

DETAILED DESCRIPTION

The system described herein includes a conversion circuit that can be used to perform oversampling of analog signals. The system also includes a pulse width modulation (PWM) controller that can generate fixed or variable frequency PWM signals to drive a load (e.g., driver for a voltage converter, driver for a motor, etc.). The conversion circuit can be used to convert an analog signal to one or more digital samples. The analog signal can be a current or voltage pertaining to the input, the output, or the load (e.g., motor current) of the system being controlled. For fixed frequency PWM operation, a central processing unit (CPU) core can program the PWM to generate a PWM signal of a particular frequency and specify the time points during each PWM cycle that the ADC is to convert the analog signal to a digital sample. Because each time point during a PWM cycle is programmable by the CPU core, the time spacing between successive digital conversions during oversampling can vary from sample to sample. The conversion circuit can thus be controlled to avoid performing analog-to-digital conversions at inappropriate times during each PWM cycle such as when power transistors of the load are switching state.

The conversion circuit also includes an accumulator to accumulate a sum of the digital values during the oversampling conversion process. That is, an adder adds a current digital sample to a sum of the previous digital values and overwrites in a register the previous sum with the new sum. In some examples, the CPU core can then calculate the average of the digital samples by reading the accumulated sum and dividing by the number of digital samples that comprise the sum. The conversion circuit is configurable to perform oversampling in which the PWM controller generates either fixed frequency or variable frequency PWM signals. For variable frequency PWM, the CPU core also can read the accumulated sum and read a register value from the conversion circuit that encodes the number of digital samples that are represented by the accumulated sum. The CPU core can then calculate the average based on those values.

Figure 1:
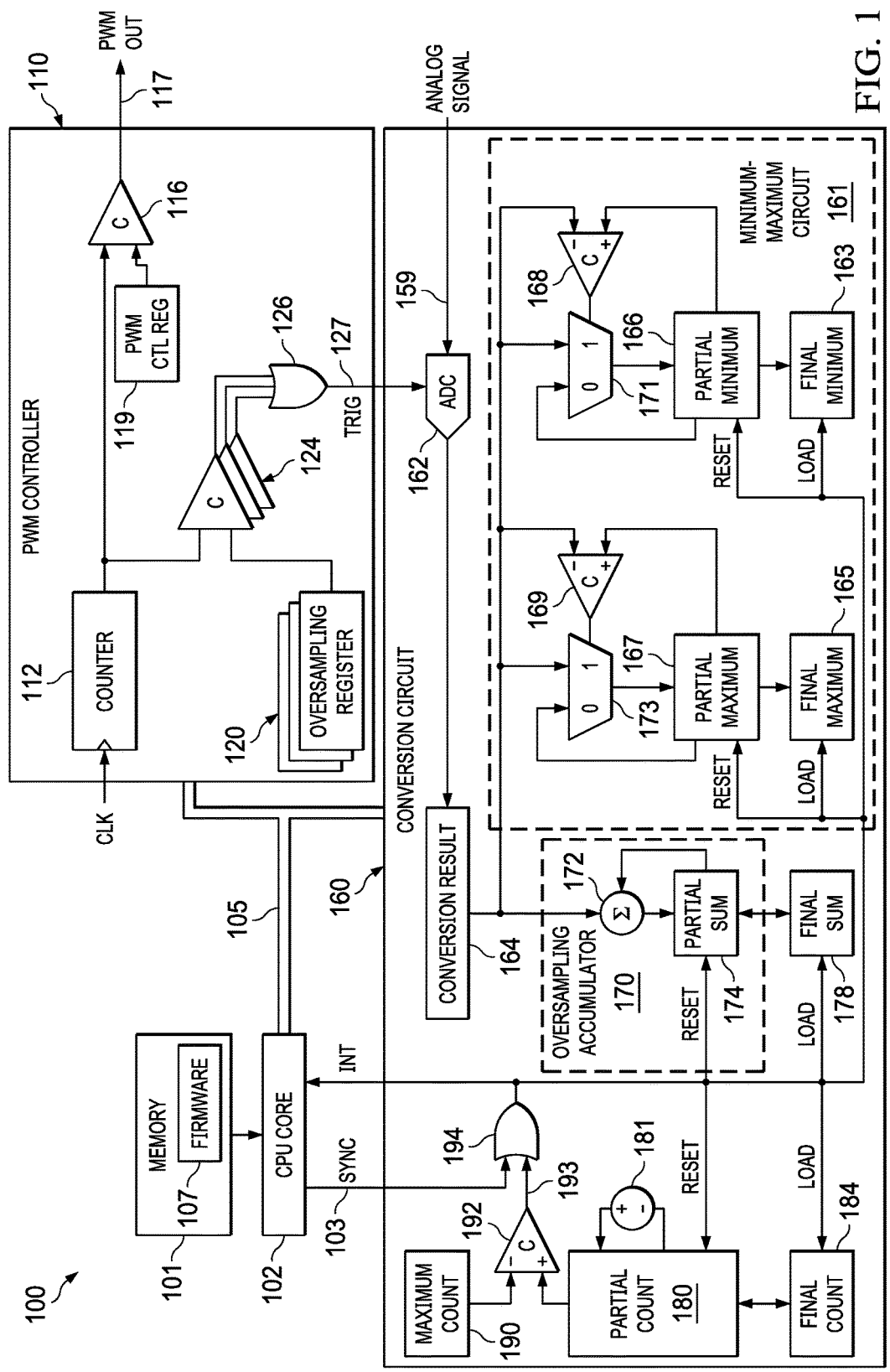
FIG. 1 illustrates a system comprising a conversion circuit in accordance with an example implementation.

FIG. 1 shows an example of a system 100 including a CPU core 102, a PWM controller 110, and a conversion circuit 160. In one implementation, the CPU core 102, the PWM controller 110, and the conversion circuit 160 are provided on a common semiconductor substrate as a system-on-chip (SoC). A single CPU core 102 is shown in the example of FIG. 1, but system 100 can include multiple CPU cores 102 as desired. The CPU core 102 couples to the PWM controller 110 and to the conversion circuit 160 via a bus 105. The functionality described herein as attributed to the CPU core 102 is performed by the CPU core 102 executing firmware 107 stored in memory 101 accessible to the CPU core.

The PWM controller 110 (and the system 100 may include multiple PWM controllers 110) includes a counter 112, digital comparators 116 and 124, PWM control register 119, an oversampling register set 120, and an OR gate 126 (or other type of logic gate). In one example, the counter 112 counts pulses of a clock (CLK) as shown. The clock may be the same clock that is used to clock the CPU core 102, or the clock may be derived from the CPU clock (e.g., the CPU clock divided by a factor, e.g., 2). The PWM control register 119 receives one or more configuration parameters from the CPU core 102. The configuration parameters may include, for example, a count value. The counter 112 in the example of FIG. 1 is programmable. In one programmable mode, the counter 112 operates as an up/down counter in which the counter 112 counts from 0 to a programmable maximum count value and then back down to 0. The CPU core 102 can program the maximum count value for the counter 112 (which specifies when the counter 112 switches from up counting to down counting) and also can load a count value into the PWM control register 119. The comparator 116 can be programmed by the CPU core 102 to perform certain actions when the counter's output count matches the count value loaded into the PWM control register 119. For example, as the counter 112 is counting up and the PWM control register's count value matches the count value from the counter 112, the comparator 116 can be programmed to cause its output, which is the PWM output signal 117, to become a logic high. Then, as the counter 112 counts down and the PWM control register's count value again matches the count value from the counter 112, the comparator 116 can be programmed to cause PWM output signal 117 to become a logic low. The count value loaded into the PWM control register 119 in effect controls the duty cycle of the PWM output signal 117 (e.g., a smaller count value in the PWM control register 119 results in a higher duty cycle, and larger count value in the PWM control register 119 results in a lower duty cycle).

In operation, the PWM controller 110 can be programmed to generate PWM output signals 117 having a fixed frequency or a variable frequency. A variable frequency for the PWM controller 110 can be implemented by programming different maximum count values for the counter 112 to switch between up-counting and down-counting. A larger maximum count value programmed into the counter 112 results in a longer period of time to count from 0 to the maximum count value and back to 0, and thus a smaller PWM frequency. Conversely, a smaller maximum count value results in a higher PWM frequency.

The oversampling register set 120 comprises one or more registers into which the CPU core 102 can program values that specify time points during each PWM cycle for which the ADC 162 of the conversion circuit 160 (described below) is to be triggered to convert an analog signal 159 to a digital sample. Multiple such values can be programmed by CPU core 102 into the oversampling register set 120 to thereby program multiple conversion trigger events during each PWM cycle. In one implementation, each value programmed into the oversampling register 120 represents a count value. When the count value from the oversampling register set 120 reaches the current value from counter 112, as determined by a comparator 124, the comparator's output becomes a logic high. The outputs from the comparators 124 are logically OR'd together by OR gate 126 to produce a trigger signal (TRIG) 127 to conversion circuit 160. TRIG 127 causes the conversion circuit to convert analog signal 159 into a digital value. Because the comparators' output signals are OR'd together, TRIG 127 is asserted when any of the comparator outputs become a logic high.

The conversion circuit 160 includes the ADC 162, a conversion result register 164, an oversampling accumulator 170, a final sum register 178, a partial count register 180, a final count register 184, a maximum count register 190, a comparator 192, an OR gate 194 (or other type of logic gate), and minimum-maximum circuit 161. Responsive to TRIG 127 being asserted, the ADC 162 converts the analog signal 159 to a digital value and stores the digital value in the conversion results register 164. The oversampling accumulator 170 includes a summer 172 and a partial sum register 174. The summer 172 adds a digital value from the conversion result register 164 to the current value from the partial sum register 174 and overwrites the partial sum register 174 with the resulting sum. As such, the oversampling accumulator 170 accumulates the digital values from the conversion result register 164 into the partial sum register 174.

The partial count register 180 stores the current count of the number of digital values that have been accumulated into the partial sum register 174. Each time a new digital value is acquired and accumulated into the partial sum register 174, the value in the partial count register 180 is incremented as indicated at 181.

In operation, the CPU core 102 can program the maximum count register 190 with a value corresponding to the amount of oversampling that the conversion circuit 160 is to perform. For example, the CPU core 102 may program a value of 10 into the maximum count register 190. The value from the maximum count register 190 is compared by comparator 192 to the current count value from the partial count register 180. When the count value in the partial count register 180 matches that the programmed value in the maximum count register 190, the output 193 of the comparator 192 is asserted high. The output 193 from the comparator 192 is provided to an input of OR gate 194. When the count value in the partial count register 180 matches the programmed value in the maximum count register 190, the output of the OR gate 194 becomes a logic high. The output of OR gate 194 then causes (a) the current count value from the partial count register 180 to be loaded into the final count register 184, (b) the current accumulated sum from the partial sum register 174 to be loaded into the final sum register 178, (c) the partial count register 180 to be reset (e.g., loaded with a value of 0), and (d) the partial count register 174 to be reset (e.g., loaded with a value of 0). The CPU core 102 can then read the final sum value from the final sum register 178. The CPU core 102 also can read the final count value from the final count register 184 if desired, but need not read register 184 as the final count value should equal to the maximum count value programmed by the CPU core 102 into the maximum count register 190. In one embodiment, the output of OR gate 194 can also interrupt the CPU core 102 to execute an interrupt service routine (ISR). The ISR then causes the CPU core 102 to read the final sum register 178.

The CPU core 102 uses the final sum value from the final sum register 178 and the count value corresponding to the number of digital samples that were accumulated to comprise the final sum value to compute a metric. In one implementation, the metric is an average of the digital samples. The CPU core 102 can compute an average by dividing the final sum value read from the final sum register 178 by the count value corresponding to the number of digital samples that represent the final sum value. The count value used to compute the metric (e.g., average) may be the value read from the final count register 184 or the maximum count value that the CPU core 102 had programmed into the maximum count register 190.

In addition to, or instead of, an average, the metric computed by the CPU core 102 may comprise the minimum sample value and a maximum sample value for the set of digital samples acquired of the analog signal 159. The minimum-maximum circuit 161 shown in FIG. 1 determines and saves to a final minimum register 163 and to a final maximum register 165 the smallest digital value and the largest digital, respectively, from the conversion results register 164. Partial minimum register 166 saves the currently determined minimum digital value during an oversampling process. Similarly, partial maximum register 167 saves the currently determined maximum digital value during an oversampling process. Comparator 168 compares the value from the partial minimum register 166 to the next acquired digital value from the conversion results register 164 and uses the comparison result as a control signal to a multiplexer 171 to overwrite the partial minimum register 166 with the new digital value from conversion results register 164 if the new digital value is smaller than the previously saved value in the partial minimum register 166; otherwise, the value already stored in the partial minimum register 166 remains in place (or is overwritten with the same value through the multiplexer 171. The partial maximum register 167, the comparator 169, and the multiplexer 173 function in much the same way but to save the largest digital sample from the conversion results register. The values from the partial minimum and maximum registers 166 and 167 can be saved to their final counterpart registers 163 and 165, respectively. The signaling described above to load the partial sum and count registers 174 and 180 into their final sum and count counterpart registers and then to reset the partial sum and count registers is also used to perform similar functions for the partial minimum and maximum registers 166, 167 and the final minimum and maximum registers 163, 165. The CPU core 102 can read the values from the final minimum register 163 and the final maximum register 165.

The example of FIG. 1 also illustrates that the CPU core 102 can assert a SYNC signal 103 to the OR gate 194 of the conversion circuit 160. Upon assertion of the SYNC signal (e.g., to a logic high state), the CPU core 102 can force the output of the OR gate 194 to become logic high thereby loading the partial sum and partial count registers 174, 180 into the final sum and final count registers 178, 184 as well as resetting the partial sum and partial count registers 174, 180. The SYNC signal 103 is useful, for example, when the PWM controller 110 is operating in a variable frequency mode. A variable frequency PWM output 117 is useful for driving resonant converters. A variable frequency PWM output 117 means that the period of the PWM output 117 also is varying. With the length of time of the PWM periods varying, the number of conversions performed by the ADC 162 within each accumulation period will vary as well.

In the variable frequency PWM operation of the PWM controller 110, the CPU 102 can program the maximum count register 190 to have a large enough value so as not to be reached by the partial count value in the partial count register 180. As such, instead of the load from the partial sum and partial count registers 174, 180 into their final sum and final count counterpart registers 178, 184 and subsequent reset of registers 174, 180 being triggered by comparator 192, the SYNC signal 103 from the CPU core 102 through OR gate 194 triggers the loads and resets. Following the loads of registers 174 and 180 into registers 178 and 184, respectively, and the subsequent reset of registers 174 and 180, the CPU core 102 then reads the final sum value from the final sum register 178 and the final count value from the final count register 184. The CPU core 102 then computes the metric as explained above.

Figure 2:
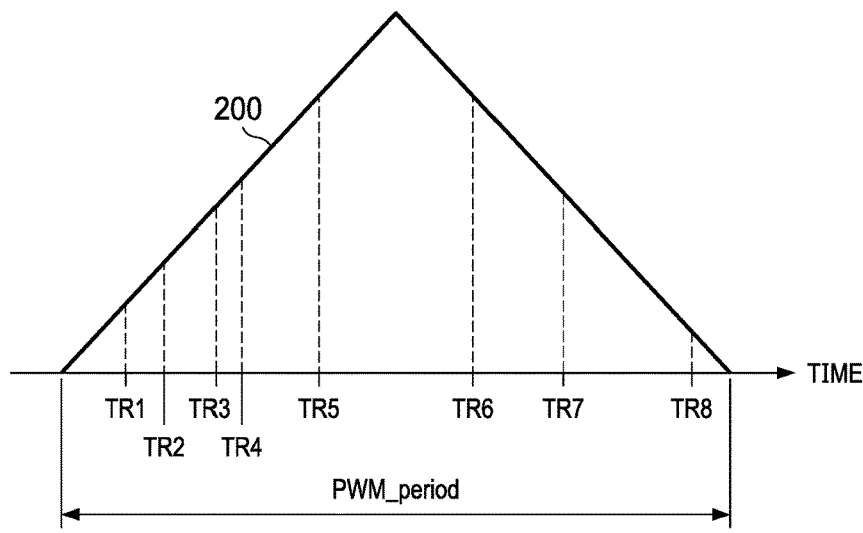
FIG. 2 illustrates variable time spacing between trigger events for analog-to-digital conversions to perform oversampling of an analog signal.

FIG. 2 illustrates a single count cycle 200 of the counter 112. The shape of the count cycle is triangular to illustrate that the counter 112 in this example counts from 0 up to a maximum programmable value and then back down to 0. The amount of time for the counter 112 to count up and back down defines the period of the PWM output 117 and is labeled in FIG. 2 as PWM_period. The example of FIG. 2 illustrates eight ADC conversion triggers TR1-TR8. Each trigger TR1-TR8 causes the conversion circuit 160 to convert the analog signal 159 to a digital value. As can be seen in FIG. 2, the time spacing between adjacent trigger points can vary. For example, TR3 and TR4 are spaced closer together than TR5 and TR6. The placement of each trigger is controlled by the values written by the CPU core 102 to the oversampling register set 120. In the example of FIG. 2, the spacing between adjacent triggers is variable, but in other implementations, the triggers can implement even spacing. Control over the placement of the triggers provides software control as to when the analog-to-digital conversions take place during each PWM cycle so as to avoid performing an analog-to-digital conversion at the moment in which power transistors of a load controlled by PWM output 117 are switching. Power transistor switching can cause switching noise which would detrimentally impact the accuracy of the analog-to-digital conversion.

Figure 3:
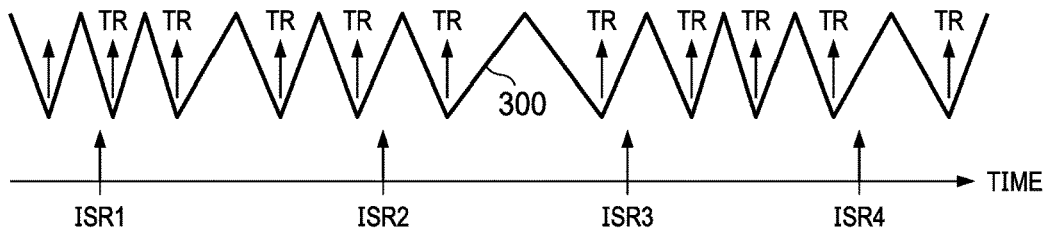
FIG. 3 illustrates oversampling for a variable frequency pulse width modulation signal.

FIG. 3 shows an example of variable frequency pulse width modulation. The triangular wave 300 represents the time progression of the counter 112 as it counts up and then down. The counter 112 completes one complete count cycle in a time period that can vary from cycle to cycle due to different maximum count values being programmed into counter 112 at which the counter switches from up counting to down counting. For variable frequency pulse width modulation, the PWM controller 110 in the example of FIG. 2 generates a trigger output 127 to the conversion circuit 160 at the same point in each cycle (e.g., at a point that avoids transistor switching noise). One way to implement the triggers during variable frequency PWM is for the CPU core 102 to program the oversampling register set 120 with a value of 0 so that TRIG 127 is generated each time the PWM's counter reaches 0 (as determined by a comparator 124). Because the period of each up/down count cycle varies, the spacing between the triggers (TR) also varies as shown.

For variable frequency pulse width modulation, the CPU core 102 is interrupted at periodic points in time as shown by ISR1-ISR4. A counter internal to the CPU core 102 can be programmed to generate an interrupt at evenly spaced time intervals. Because the conversion triggers (TR) may not be evenly spaced, there may be a different number of triggers TR between successive executions of the ISR. For example, between ISR1 and ISR2, there are four triggers TR, but between ISR2 and ISR3, there are only two triggers TR. For each execution of the ISR, the CPU core 102 asserts the SYNC signal 103 to load values into the final sum and count registers 178, 184 (and then to reset the partial sum and count registers 174, 180). The CPU core 102 can then compute the metric (e.g., average) using both the final sum and final count values as described above.

Figure 4:
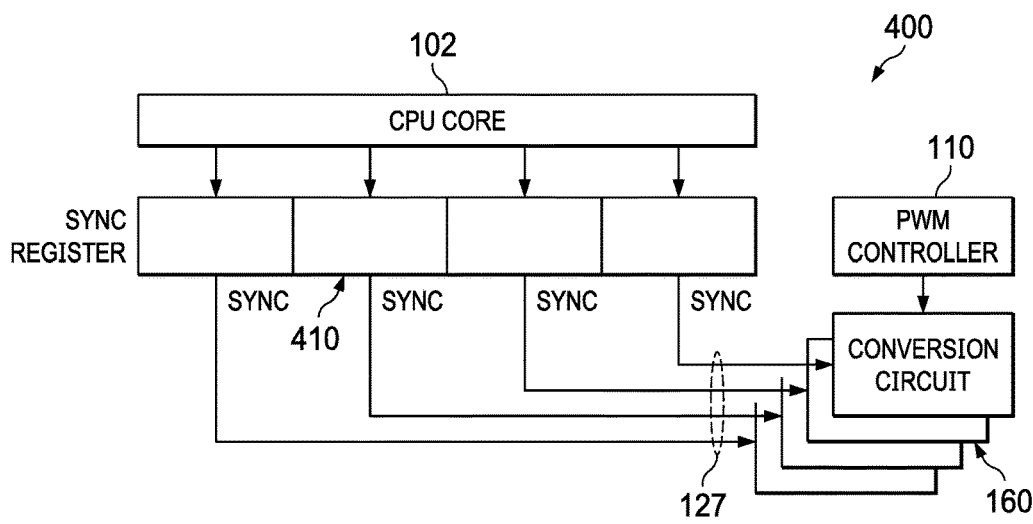
FIG. 4 shows an example for performing a global synchronization of multiple conversion circuits.

FIG. 4 shows an example of a system 400 that includes multiple conversion circuits 160 coupled to the CPU core and the PWM controller 110. In one configuration, each conversion circuit 160 is implemented per the conversion circuit implementation illustrated in FIG. 1. As such, each conversion circuit 160 in FIG. 4 can receive a separate SYNC signal 127 from the CPU core 102. A sync register 410 is writeable by the CPU core to identify one or more of the conversion circuits 160 for which its accumulated sum is to be transferred from its partial sum register 174 to its final sum register 178 and the count value is to be transferred from its partial count register 180 to its final count register 184. The CPU core 102 can then read the final sum register 178 and final count register 184 from the corresponding conversion circuits 160 and compute the metric as explained above. In one implementation, each conversion circuit 160 corresponds to a bit in the sync register 410. By writing, for example, a logic 1 to a particular bit in the sync register 410, the conversion circuit corresponding to that bit will perform the load and reset operations described above. Any bit in the sync register 410 not written with a logic 1 will not cause the corresponding conversion circuit 160 perform the load and reset operations.

Figure 5:
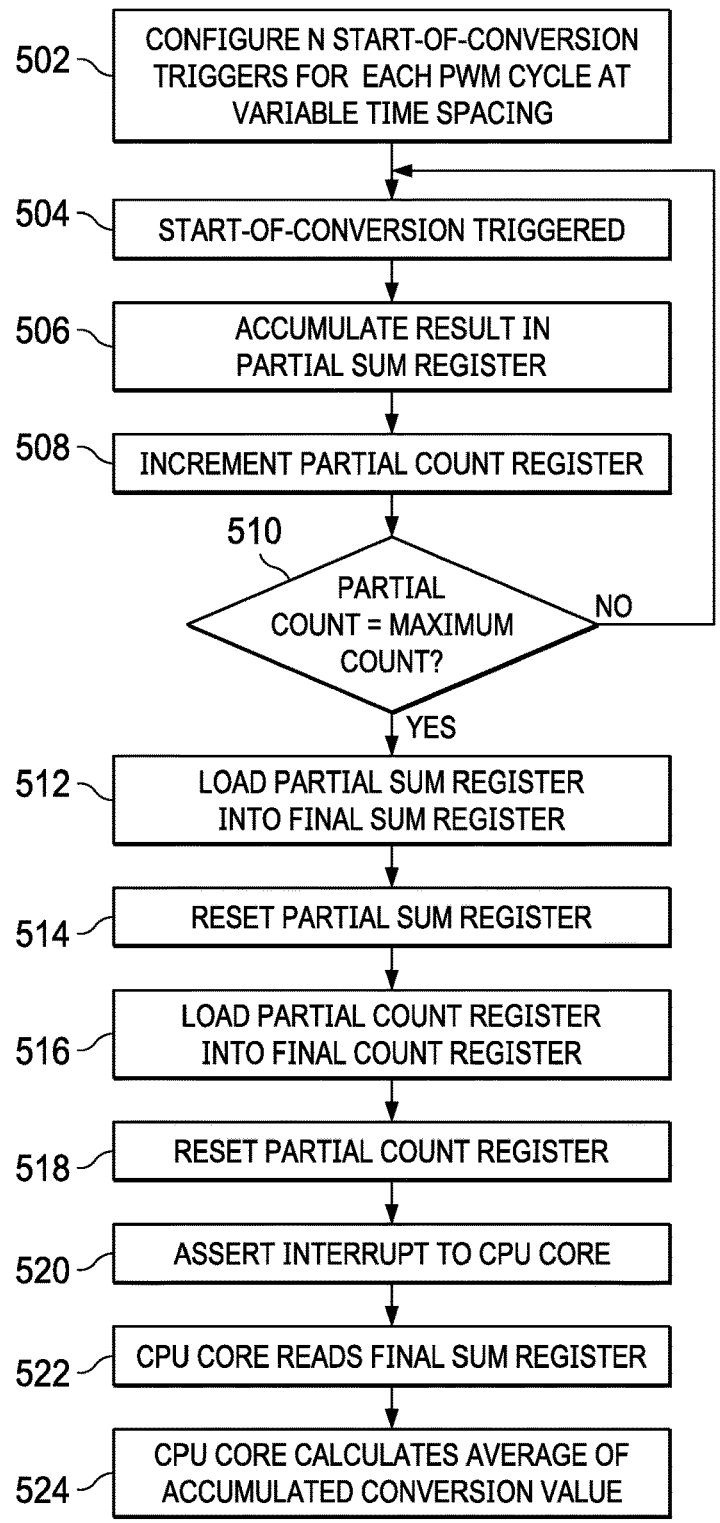
FIG. 5 shows an example of a method for performing oversampling with a fixed frequency pulse width modulation signal.

FIG. 5 illustrates a method corresponding to fixed frequency pulse width modulation operation. The operations can be performed in the order shown, or in a different order. At 502, the method includes configuring N start-of-conversion triggers for each PWM cycle at variable time spacing. That is, the time between successive triggers need not be constant. This operation can be performed by the CPU core 102 loading count values into the oversampling register set 120.

At 504, the method includes triggering one of the analog-to-digital conversions by the conversion circuit 160. A trigger signal (TRIG 127 in the example of FIG. 1) is asserted by the PWM controller 110 to the conversion circuit 160 to initiate the conversion process. The trigger occurs based on the values in the oversampling register set 120. The accumulated result at 506 is computed based on the current digital sample and the previous accumulated value and the accumulated result is stored in the partial sum register 174 (e.g., the new accumulated result overwrites the previous accumulated result in the partial sum register 174). At 510, the method includes determining whether the partial count value in the partial count register 180 equals the maximum count from the maximum count value registers 190. This determination can be performed by comparator 192. If the partial count value has not yet reached the maximum count value, then control loops back to 502 for another conversion at the appropriate time defined by the values in the oversampling register set 120.

Once the partial count value reaches the maximum count value, then control continues at 512 in which the value from the partial sum register 174 is loaded into the final sum register 178. At 514, the partial sum register 174 is reset (e.g., to a value of 0). At 516, the value from partial count register is loaded into the final count register 184 and, at 518, the partial count register is reset (e.g., to a value of 0.

Figure 6:
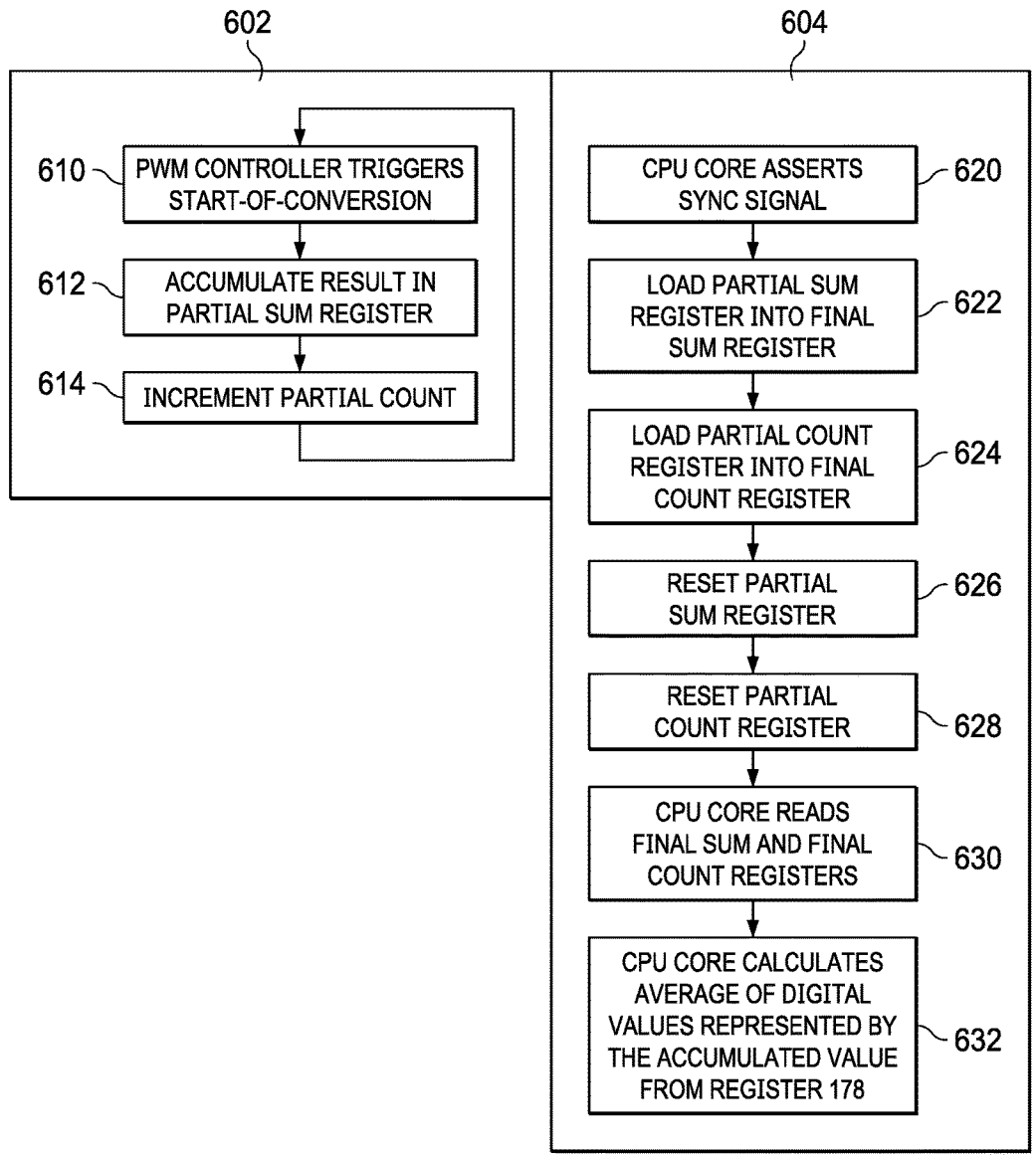
FIG. 6 shows an example of a method for performing oversampling with a variable frequency pulse width modulation signal.

At 520, an interrupt is asserted to the CPU core 102 (e.g., by the output of the OR gate 194). At 522, the CPU core 102 responds by executing an ISR to read the accumulated conversion value from the final sum register 178 and compute at 524 an average (or other type of metric) of the accumulated conversion value FIG. 6 illustrates a method corresponding to variable frequency pulse width modulation operation. The operations can be performed in the order shown, or in a different order. FIG. 6 illustrates two work flows 602 and 604 that generally execute concurrently with other. That is, while work flow 602 is executing, work flow 604 also can execute. Work flow 602 includes operations 602-614, and work flow 604 includes operations 620-632.

At 610, the method includes the PWM controller 110 triggers a start-of-conversion to the conversion circuit 160. This trigger event may occur at the same point during each PWM cycle as explained above. Once the digital value is acquired, the accumulated sum at 612 is updated and the new accumulated sum is used to overwrite the accumulated sum in the partial sum register. At 614, the partial count register 180 is incremented and control loops back to 610 for the next start-of-conversion trigger event.

When programmed into the CPU core 102 (e.g., at periodic time occurrences), the CPU core 102 asserts the SYNC signal 103. In response to the assertion of the SYNC signal 103, at 622 the value from the partial sum register 174 is loaded into the final sum register 178 and at 624, the value from the partial count register 180 is loaded into the final count register 184. The partial sum register 174 and the partial count register 180 are reset at 626 and 628, respectively. At 630, the CPU core 102 then reads the final sum register 178 and the final count register 184 and then calculates at 632 the average (or other metric) of the digital values represented by the accumulated value.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A system, comprising:
    a central processing unit (CPU) core;
    a pulse width modulator (PWM) controller coupled to the CPU core and configured to generate a PWM control signal having a PWM cycle;
    an analog-to-digital converter (ADC) coupled to the PWM controller;
    an accumulator coupled to the ADC;
    a sum register coupled to the accumulator; and
    an oversampling register set configurable by the CPU core to specify time points during each PWM cycle when the ADC is to convert an analog signal to a digital sample to produce a plurality of digital samples, wherein time spacing between consecutive digital samples varies among the specified time points;
    wherein the accumulator is to accumulate digital samples from the ADC and store an accumulated sum in the sum register; and
    wherein the CPU core is to read the accumulated sum from the sum register.

2. The system of claim 1, further comprising a count register that is to be incremented for each conversion performed by the ADC.

3. The system of claim 2, wherein the count register is readable by the CPU core.

4. The system of claim 2, wherein the CPU core is to read a value from the count register and to calculate a metric based on the accumulated sum and the value read from count register.

5. The system of claim 4, wherein the PWM controller asserts a signal to trigger the ADC to convert the analog signal to the digital sample.

6. The system of claim 1, wherein the CPU core is to calculate a metric based on the accumulated sum.

7. The system of claim 6, wherein the PWM controller includes a counter and the PWM controller asserts a signal to trigger the ADC to convert the analog signal to the digital sample based on a count value from the counter that matches any of a plurality of values in the oversampling register set.

8. The system of claim 1, wherein:
    the sum register is a final sum register;
    the accumulator includes a partial sum register into which the accumulated sum is updated on each of a plurality of conversions performed by the ADC; and
    the accumulated sum is transferred from the partial sum register into final sum register based on assertion of a signal from the CPU core.

9. The system of claim 1, wherein the sum register is a final sum register and the system further comprising:

a comparator; and a partial count register to include a count value that is to be incremented each time the ADC performs a conversion of the analog signal to a digital sample; and a maximum count value configurable by the CPU core to include a maximum count value;

wherein:
the accumulator includes a partial sum register into which the accumulated sum is updated on each of a plurality of conversions performed by the ADC;

the comparator is to compare the value from the partial count register to the maximum count value; and based on a signal from the comparator indicative of the value form the partial count register reaching the maximum count value, the accumulated sum is to be transferred from the partial sum register to a final sum register and the count value is to be transferred from the partial count register to a final count register.

10. The system of claim 9, further comprising:
a plurality of conversion circuits, each conversion circuit including a final sum register, a partial sum register, a partial count register and a final count register; and
a sync register that is writeable by the CPU core to identify one or more of the conversion circuits for which its accumulated sum is to be transferred from its partial sum register to its final sum register and the count value is to be transferred from its partial count register to its final count register.

11. A system, comprising:
a central processing unit (CPU) core;
a pulse width modulator (PWM) controller coupled to the CPU core and configured to generate a PWM control signal having a PWM cycle;
an analog-to-digital converter (ADC) coupled to the PWM controller, the ADC to convert an analog signal into a digital sample;
an oversampling register set configurable by the CPU core to specify time points during each PWM cycle when the ADC is to convert an analog signal to a digital sample to produce a plurality of digital samples, wherein time spacing between consecutive digital samples varies among the specified time points;
an accumulator coupled to the ADC, the accumulator including a partial sum register into which an accumulated value of the digital samples from the ADC is stored; and
a final sum register to be loaded with the accumulated value from the partial sum register in response to a signal;

wherein the CPU core is to read the accumulated sum from the final sum register.

12. The system of claim 11, wherein the CPU core is to calculate, based on the accumulated value, at least one of an average, a minimum value and a maximum value.

13. The system of claim 11, wherein the PWM controller includes a counter and the PWM controller asserts a signal to trigger the ADC to convert the analog signal to the digital sample based on a count value from the counter that matches any of a plurality of values in the oversampling register set.

14. The system of claim 11, wherein the accumulated value is transferred from the partial sum register into final sum register based on assertion of a signal asserted by the CPU core.

15. The system of claim 14, wherein the signal asserted by the CPU core also is to cause the partial sum register to be reset.

16. A system, comprising:
a central processing unit (CPU) core;
a pulse width modulator (PWM) controller coupled to the CPU core and configured to generate a PWM control signal having a PWM cycle;
an analog-to-digital converter (ADC) coupled to the PWM controller, the ADC to convert an analog signal into a digital sample in response to a trigger signal generated by the PWM controller;
an accumulator coupled to the ADC, the accumulator including a partial sum register into which an accumulated value of the digital samples from the ADC is stored;
a final sum register to be loaded with the accumulated value from the partial sum register in response to a signal; and
a final count register to store a count value indicative of the number of conversions performed by the ADC;
wherein the CPU core is to read the accumulated sum from the final sum register and the count value from the final count register.

17. The system of claim 16, further comprising a partial count register to be incremented each time the ADC is triggered by the PWM controller to perform a conversion.

18. The system of claim 17, wherein in response to a signal asserted by the CPU core, a value from the partial count register is to be transferred to the final count register.

19. The system of claim 18, wherein the CPU core is to read a value from the final count register and to divide the accumulated value read from the final sum register by the value read from the final count register.

20. The system of claim 16, wherein the system is a system-on-chip.

* * * * *